US010707837B2

(12) United States Patent
Poulton et al.

(10) Patent No.: US 10,707,837 B2
(45) Date of Patent: Jul. 7, 2020

(54) LASER FREQUENCY CHIRPING STRUCTURES, METHODS, AND APPLICATIONS

(71) Applicant: ANALOG PHOTONICS LLC, Boston, MA (US)

(72) Inventors: Christopher Poulton, Cambridge, MA (US); Matthew Byrd, Cambridge, MA (US); Ehsan Hosseini, Milton, MA (US); Erman Timurdogan, Cambridge, MA (US); Michael Watts, Hingham, MA (US)

(73) Assignee: Analog Photonics LLC, Boston, MA (US)

( * ) Notice: Subject to any disclaimer, the term of this patent is extended or adjusted under 35 U.S.C. 154(b) by 13 days.

(21) Appl. No.: 16/028,123

(22) Filed: Jul. 5, 2018

(65) Prior Publication Data

US 2019/0013798 A1    Jan. 10, 2019

Related U.S. Application Data

(60) Provisional application No. 62/529,031, filed on Jul. 6, 2017.

(51) Int. Cl.
*H03H 17/08* (2006.01)
*H03H 11/22* (2006.01)
*H01S 1/00* (2006.01)
*G02F 2/02* (2006.01)

(52) U.S. Cl.
CPC ............. *H03H 17/08* (2013.01); *G02F 2/02* (2013.01); *H01S 1/005* (2013.01); *H03H 11/22* (2013.01); *G02F 2203/25* (2013.01)

(58) Field of Classification Search
CPC ......... H03H 17/08; H03H 11/22; H01S 1/005
See application file for complete search history.

(56) References Cited

U.S. PATENT DOCUMENTS

| 4,752,120 A * | 6/1988 | Shimizu | G02B 6/126 |
| | | | 359/239 |
| 5,126,870 A * | 6/1992 | Murphy | G02F 1/0327 |
| | | | 398/186 |
| 6,614,512 B1 * | 9/2003 | Sakamoto | G01M 11/3163 |
| | | | 356/73.1 |

(Continued)

FOREIGN PATENT DOCUMENTS

| WO | 9625780 A1 | 8/1996 |
| WO | 2008084929 A1 | 7/2008 |
| WO | 2013022667 A1 | 2/2013 |

OTHER PUBLICATIONS

Hmood J.K. et al. Optical frequency comb generation based on chirping of Mach-Zehnder Modulators, Optical Communication, 2015, 344.

*Primary Examiner* — Thomas J. Hiltunen
(74) *Attorney, Agent, or Firm* — Young Basile Hanlon & MacFarlane, P.C.

(57) ABSTRACT

Aspects of the present disclosure describe systems, methods, and structures including integrated laser systems that employ external chirping structures that may advantageously include phase shifters and/or one or more filters. Further aspects of the present disclosure describe systems, methods, and structures including laser systems that employ external chirping structures that may advantageously include optical phased arrays.

24 Claims, 12 Drawing Sheets

(56) References Cited

U.S. PATENT DOCUMENTS

| | | | | |
|---|---|---|---|---|
| 6,885,490 B2* | 4/2005 | Dorrer | G01J 11/00 359/278 |
| 7,382,817 B2* | 6/2008 | He | H01S 5/0612 372/64 |
| 7,417,744 B2* | 8/2008 | Cooke | G01B 11/24 356/512 |
| 7,433,564 B2* | 10/2008 | Futami | H04B 10/25137 359/237 |
| 7,742,152 B2* | 6/2010 | Hui | G01S 7/4917 356/5.09 |
| 8,095,018 B2* | 1/2012 | Sekine | G02F 1/0123 398/157 |
| 8,659,748 B2* | 2/2014 | Dakin | G01S 7/4814 356/4.09 |
| 8,666,200 B2* | 3/2014 | Takabayashi | G02F 1/0123 385/3 |
| 8,818,142 B2* | 8/2014 | Hayakawa | G02F 1/2257 385/3 |
| 8,913,636 B2* | 12/2014 | Roos | H01S 3/1305 372/12 |
| 9,268,129 B2* | 2/2016 | Hsu | B81C 99/003 |
| 9,366,937 B2* | 6/2016 | Sudo | H04B 10/508 |
| 9,784,560 B2* | 10/2017 | Thorpe | G01B 9/02007 |
| 10,036,812 B2* | 7/2018 | Crouch | G03H 1/0443 |
| 10,378,964 B2* | 8/2019 | Takahashi | |
| 10,416,302 B2* | 9/2019 | Smith | H01Q 15/0086 |
| 2002/0071109 A1* | 6/2002 | Allen | G01S 17/34 356/5.01 |
| 2011/0097029 A1* | 4/2011 | Sakamoto | G02F 1/225 385/3 |
| 2014/0071249 A1* | 3/2014 | Aflatouni | H04N 13/207 348/49 |
| 2016/0377721 A1* | 12/2016 | Lardin | G01S 17/58 356/5.09 |
| 2019/0025431 A1* | 1/2019 | Satyan | G01S 7/4915 |
| 2019/0154835 A1* | 5/2019 | Maleki | G01S 17/89 |
| 2019/0265351 A1* | 8/2019 | Madison | G01S 7/285 |
| 2019/0339389 A1* | 11/2019 | Russo | G01S 17/42 |
| 2019/0391243 A1* | 12/2019 | Nicolaescu | G01S 7/4817 |

* cited by examiner

LASER FREQUENCY CHIRPING STRUCTURES, METHODS, AND APPLICATIONS

CROSS REFERENCE TO RELATED APPLICATIONS

This application claims the benefit of U.S. Provisional Patent Application Ser. No. 62/529,031 filed 6 Jul. 2017 which is incorporated by reference as if set forth at length herein.

TECHNICAL FIELD

This disclosure relates generally to laser systems and more particularly to systems, methods, and structures that control the "chirp" of lasers that are useful—for example—in applications involving imaging, ranging, sensing, and optical communications—among others.

BACKGROUND

As is known, laser systems and light generated therefrom have found widespread applicability in an innumerable number of contemporary application areas including medicine, communications, transportation, and navigation—among others. Of importance to these applications, the laser light oftentimes must be spectrally broadened and exhibit an altered output frequency as a function of time ("chirped"). Accordingly, systems, methods, and structures that facilitate the production and/or control of such chirped laser light would represent a welcome addition to the art.

SUMMARY

An advance in the art is made according to aspects of the present disclosure directed to systems, methods, and structures—including integrated laser systems that employ external chirping structures that may advantageously include phase shifters and/or one or more filters.

In sharp contrast to the prior art—systems, methods, and structures according to aspects of the present disclosure advantageously chirp the laser light with an external structure do not require or employ varying laser current or temperature as typically done in the art.

In an illustrative embodiment, the phase shifters are configured and driven such that light output from the laser is phase shifted and is quadratically varying in phase.

Accordingly—and viewed from a first aspect—the present disclosure illustrative describes a frequency chirping structure comprising: a laser for generating a beam of laser light; a phase shifter that shifts the phase of the laser light in response to an input voltage; and a driving circuit that generates the input voltage, wherein the generated input voltage varies as a function of time such that the phase of the laser light is shifted quadratically.

Viewed from another aspect the present disclosure illustratively describes a phase shifting structure comprising: a laser that generates laser light; a plurality of phase shifters, each individual one of the phase shifters configured to shift the phase of the laser light in response to an input voltage; a driving circuit that generates the input voltage; an optical distribution network configured to optically connect the laser with an input of each individual one of the plurality of phase shifters; and an output optical combination network that receives phase shifted laser light output from each individual one of the plurality of phase shifters and combines the received light into a common output.

Viewed from yet another aspect of the present disclosure illustratively describes an optical structure comprising: a laser that outputs laser light; a frequency chirping structure that receives the laser light and generates frequency chirped light; a transmit aperture including phased array elements that emits the frequency chirped light into an interrogation area; a receive aperture including phased array elements that receives frequency chirped light backscattered from the interrogation area; and a coherent detector that receives frequency chirped light from the chirping structure and the received backscattered light for processing.

Viewed from still another aspect of the present disclosure illustratively describes a method of providing a beam of electromagnetic radiation exhibiting a time varying frequency, the method comprising: providing a beam of electromagnetic radiation from a laser source; directing the beam provided to a phase shifting device, said phase shifting device responsive to an input voltage; and applying a time varying input voltage to the phase shifter device such that an output beam of electromagnetic radiation exhibits a time-varying frequency and quadratically varying phase.

BRIEF DESCRIPTION OF THE DRAWING

A more complete understanding of the present disclosure may be realized by reference to the accompanying drawing in which.

The illustrative embodiments are described more fully by the Figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGS. comprising the drawing are not drawn to scale.

In accordance with aspects of the present disclosure, a phase shifter is coupled to the output of a laser. The phase shifter is selectively controlled such that a desirable chirp to the laser output is produced and subsequently output.

Figure 1:
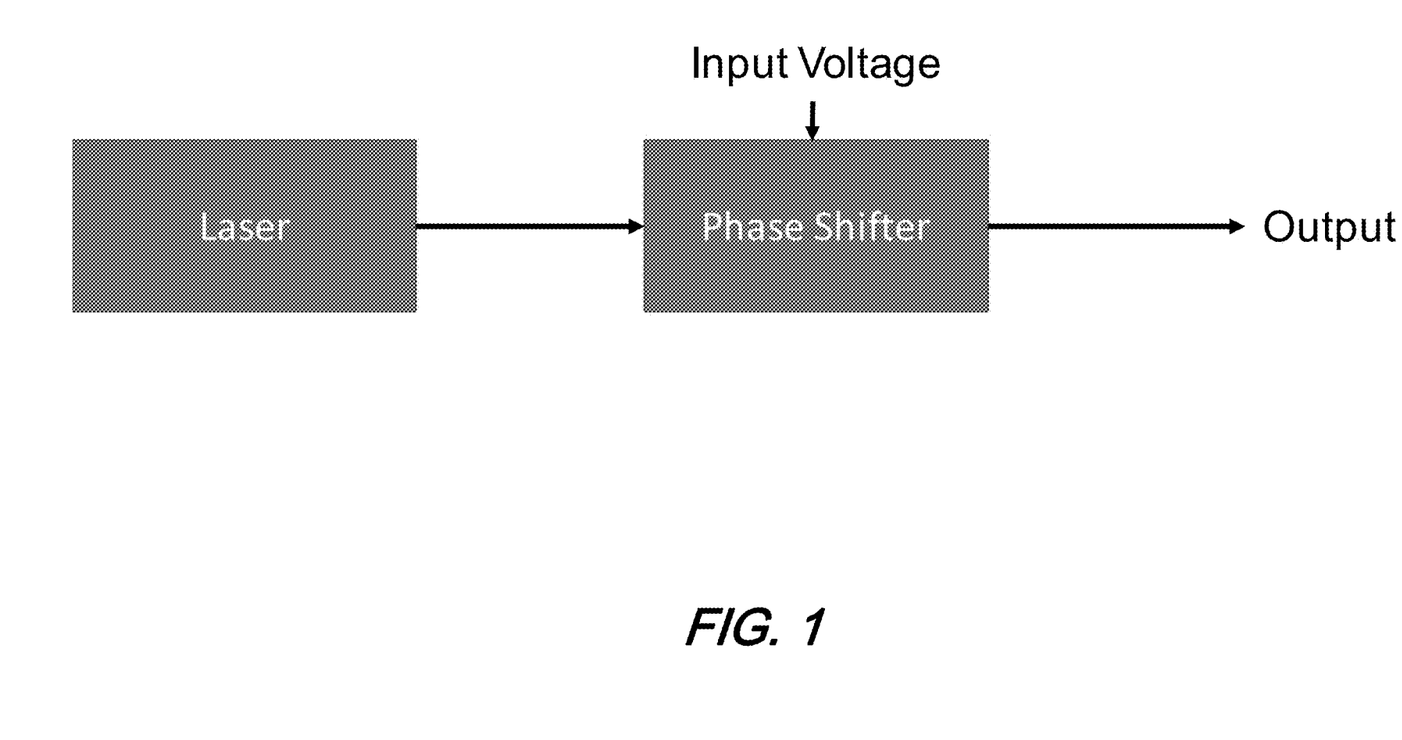
FIG. 1 is a schematic diagram showing an illustrative laser system chirped by an external phase shifter according to according to aspects of the present disclosure.

Turning now to FIG. 1, there is shown a schematic block diagram of a structure illustrative of aspects of the present disclosure. As illustratively shown in that figure, light output from a laser is optically coupled to and received by a phase shifter which is controlled by an input voltage. Upon application of the input voltage, the phase shifter imparts a phase shift on the received laser light in which phase shifted laser light is subsequently output by the phase shifter as chirped laser light.

At this point we note that the components employed may be any of a variety known in the art. For example, lasers contemplated include solid state, and semiconductor ones—among others. Advantageously, when semiconductor lasers are employed they may be integrated with the phase shifting and filtering elements (see, e.g., FIG. 6) using contemporary silicon photonic techniques and materials. Similarly, phase shifters employed may be any of a number of known types and/or structures including electro-optic, thermal, resonant cavity, acousto-optic, micro-electromechanical (MEMS), and liquid crystal.

According to one aspect of the present disclosure, the input voltage applied to the phase shifter is varied in time such that the light output from the phase shifter is desirably chirped. As we shall show and describe, in this inventive manner, the phase shifter is effectively operated using a technique in which a mathematical integral of a required frequency shift function is applied to the light output from the phase shifter as a phase shift. As we shall further show, the resulting phase shift is in the range of 0 to $2\pi$—with modulo $2\pi$ phase jumps.

Figure 2A:
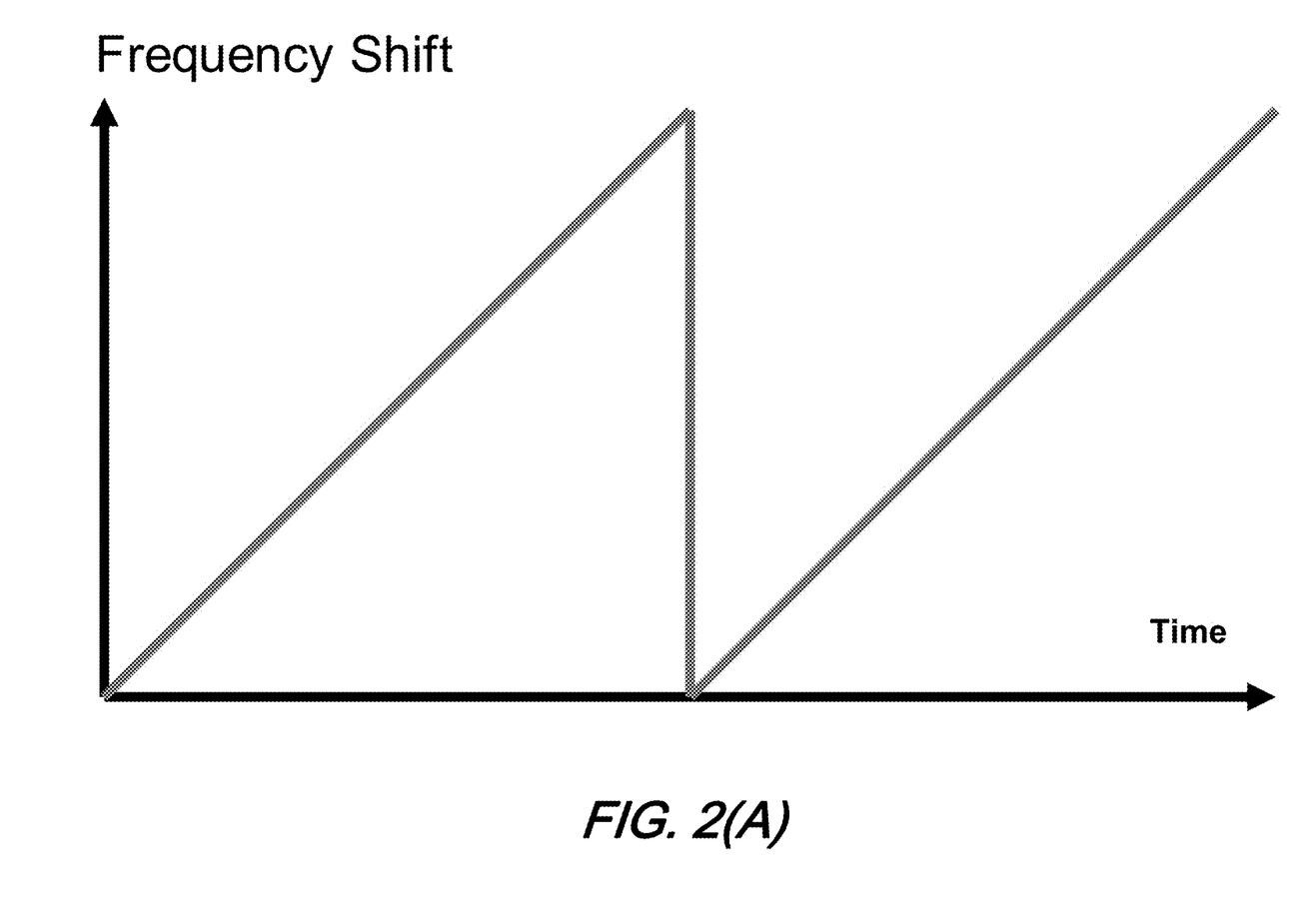
FIG. 2(A) is a plot illustratively showing frequency shift as function of time (chirp) according to aspects of the present disclosure.

FIG. 2(A) is a plot illustratively showing frequency shift as function of time (chirp) according to aspects of the present disclosure.

Figure 2B:
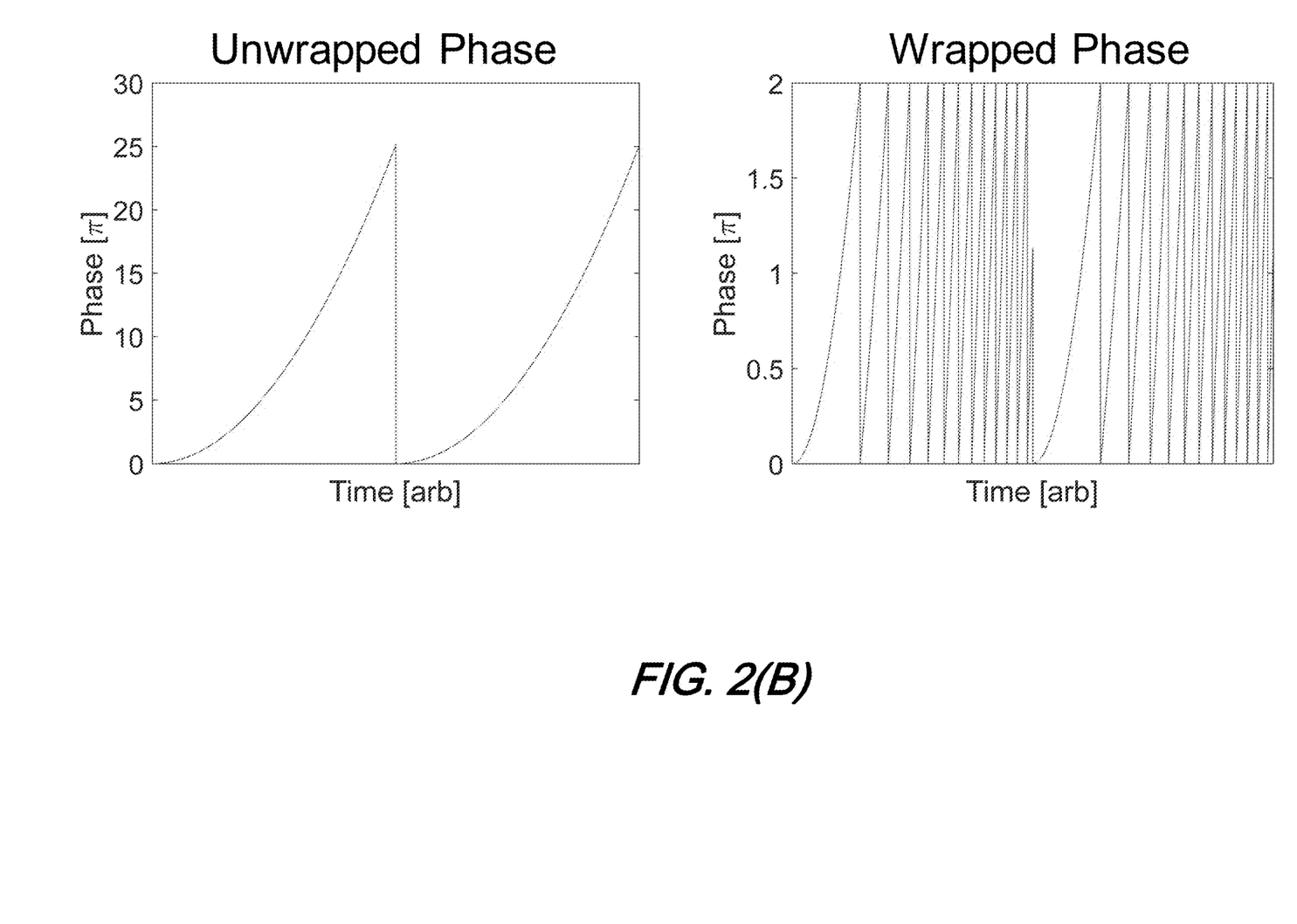
FIG. 2(B) (left) is a plot of phase vs. time and FIG. 2(B) (right) is a plot showing the "wrapping", i.e. a plot illustrating phase modulation with a voltage dependent phase shifter in which a phase function is "wrapped" in a 0 to $2\pi$ interval—both according to aspects of the present disclosure.

FIG. 2(B) (left) is a plot of phase vs. time and FIG. 2(B) (right) is a plot showing the "wrapping", i.e. a plot illustrating phase modulation with a voltage dependent phase shifter in which a phase function is "wrapped" in a 0 to $2\pi$ interval—both according to aspects of the present disclosure;

Those skilled in the art will recognize and understand that there exists a relationship between frequency and phase defined by:

$$\omega(t) = \frac{d\theta(t)}{dt} = \frac{d(\omega_0 t + \theta_{PS}(t))}{dt} = \omega_0 + \Delta\omega(t)$$

where $\omega(t)$ is the instantaneous frequency of the light, $\theta(t)$ is the phase of the light, $\omega_0$ is the frequency of the input laser, $\theta_{PS}(t)$ is the instantaneous phase contribution of the phase shifter, and $\Delta\omega(t)$ is the instantaneous frequency shift caused by the phase shifter.

Figure 2C:
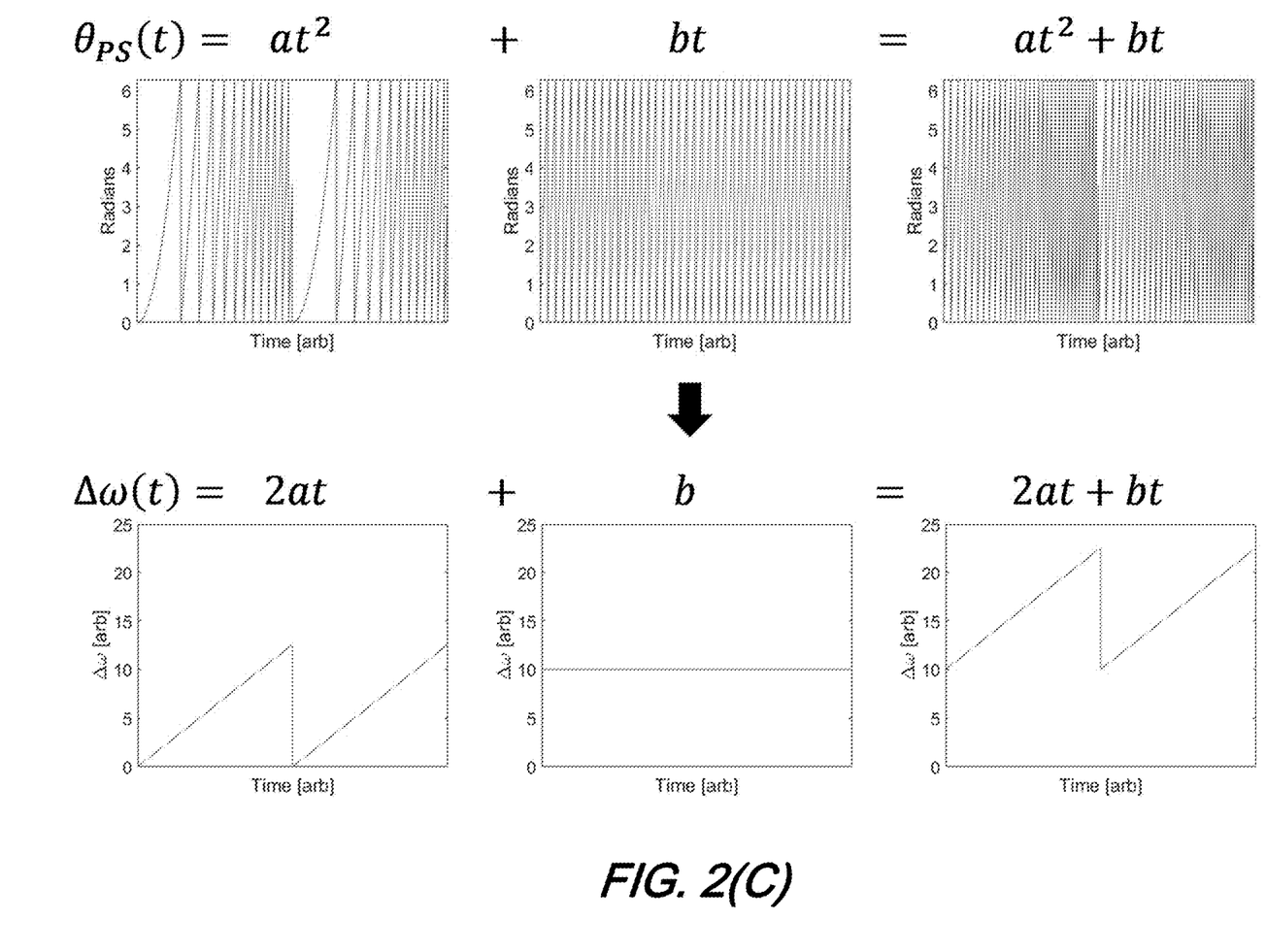
FIG. 2(C) is a series of plots illustrating relationships between the phase, frequency and offset(s) according to aspects of the present disclosure.

FIG. 2(C) is a series of plots illustrating the combination of chirp and offset according to aspects of the present disclosure. As may be observed from that figure, chirp (2at) and offset (b) may be combined into a combined waveform (2at+bt).

Figure 2D:
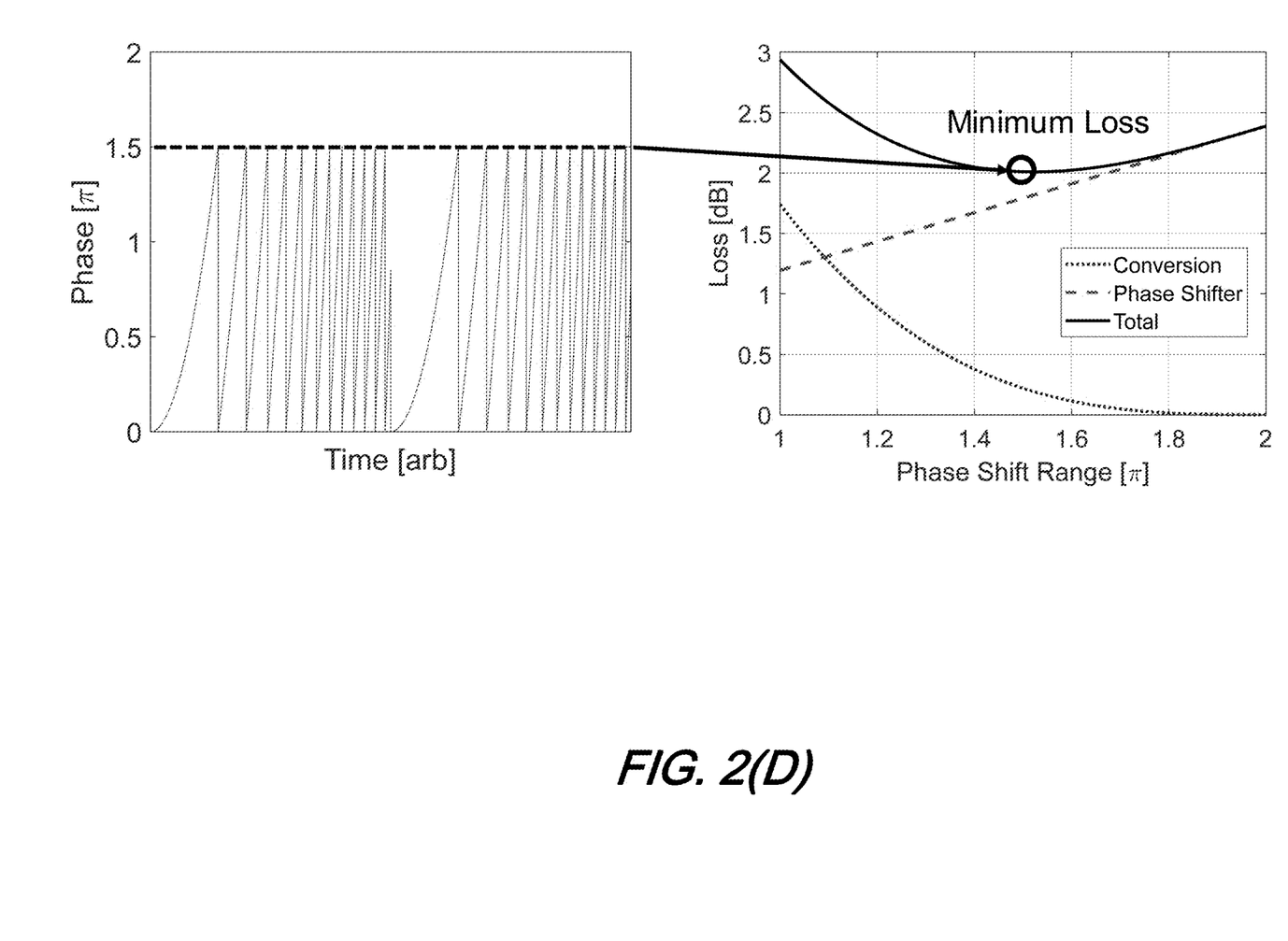
FIG. 2(D) is a set of plots illustrating relationships between the phase and loss experienced over 0 to $2\pi$ phase range and an optimized drive phase shift range according to aspects of the present disclosure.
Figure 2E:
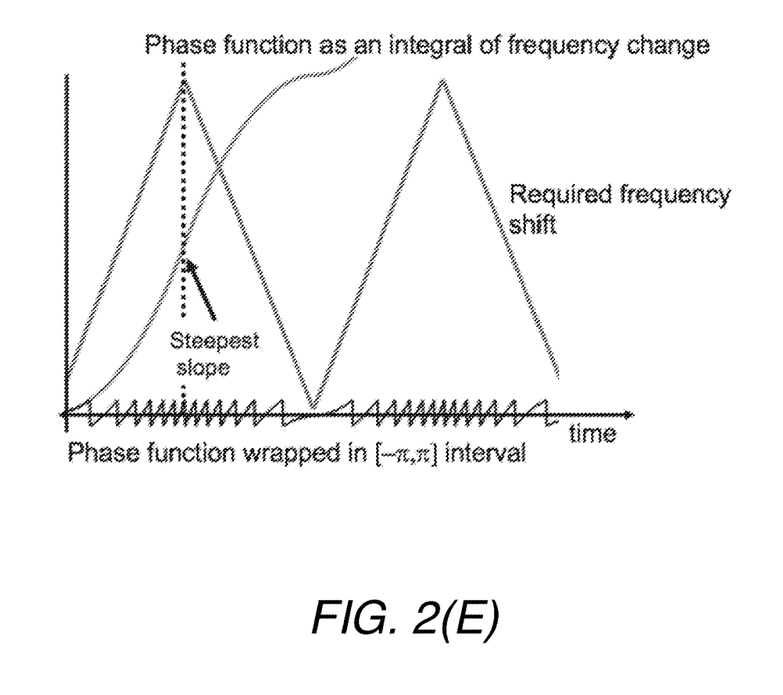
FIG. 2(E) and FIG. 2(F) are plots illustratively showing phase modulation with a voltage dependent phase shifter for a triangular-wave frequency shift—both according to aspects of the present disclosure.
Figure 2F:
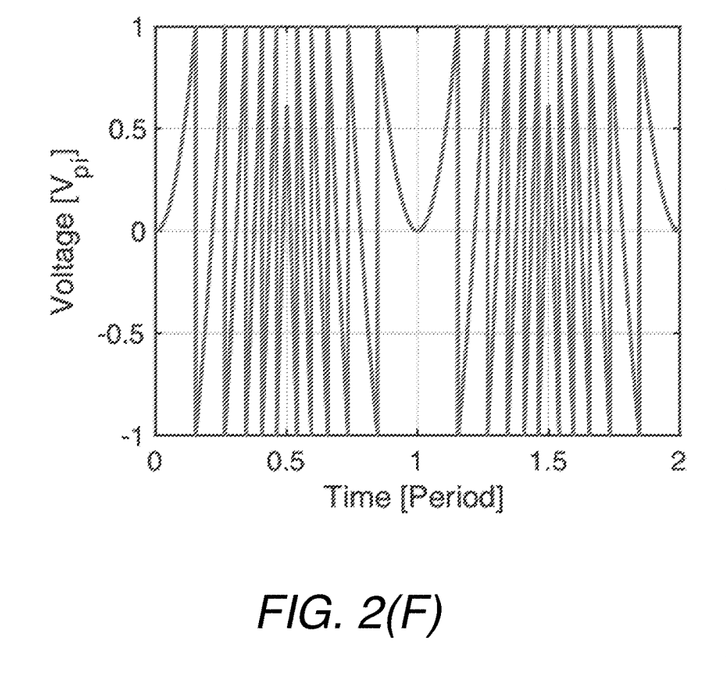

FIG. 2(D) is a set of plots illustrating relationships between the phase and loss experienced over 0 to $2\pi$ phase range and an optimized drive phase shift range according to aspects of the present disclosure;

As can be seen in FIG. 2(E) and FIG. 2(F), if a triangular-wave frequency shift is required, the phase curve is a collection of quadratic curves. The modulo-$2\pi$ version of the phase function is wrapped in the [$-\pi$, $\pi$] range and is produced by a phase modulator that is swept across $-V\pi$ and $V\pi$. As the frequency approached the peak point in the triangular wave the slope of the phase function increases.

Figure 3:
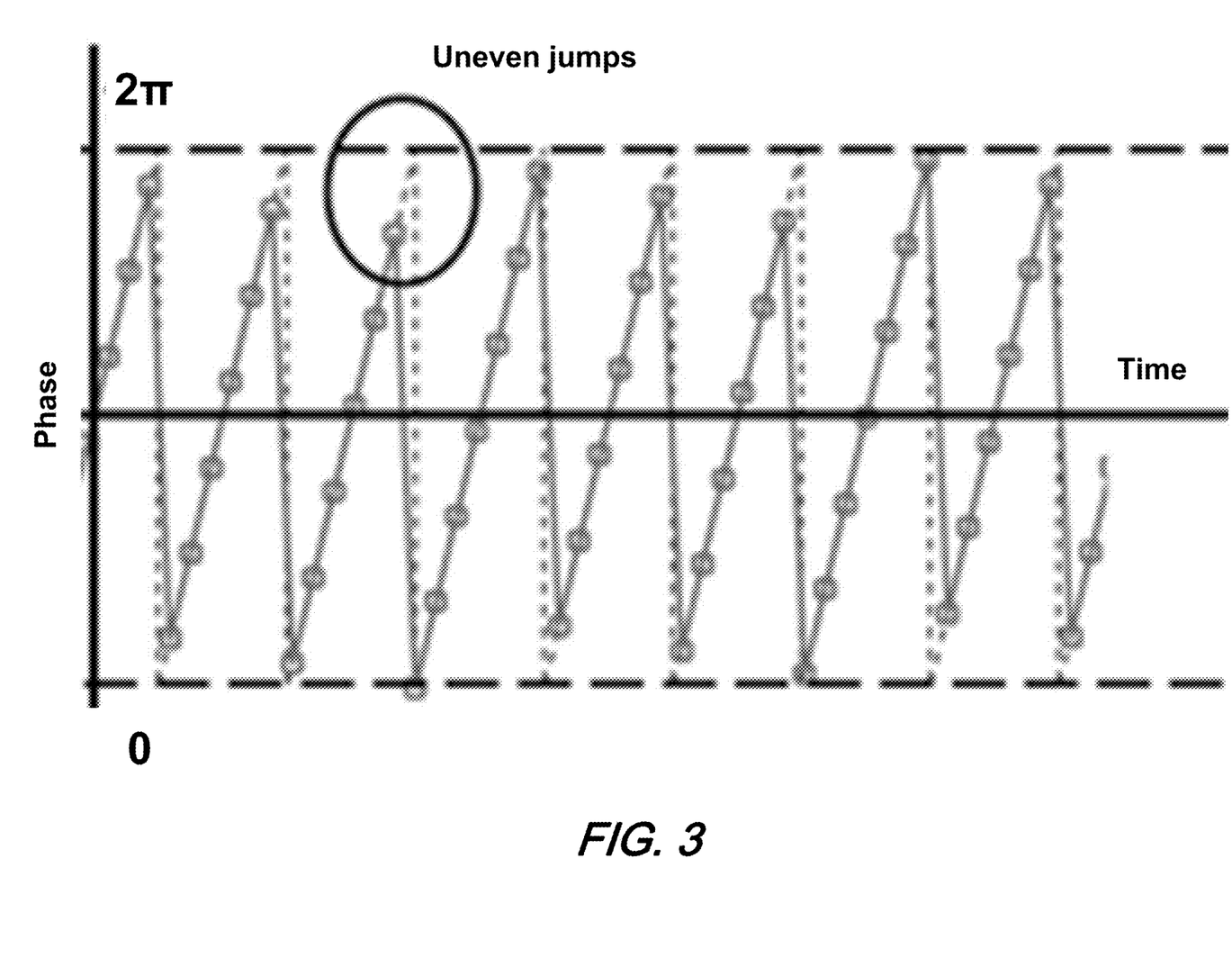
FIG. 3 is a plot illustrating phase shifting voltage(s) producing 0 to $2\pi$ phase shift(s) illustrating that if the sample rate of the phase shifting voltage function is not sufficiently high, the phase function experiences random/uneven jumps according to aspects of the present disclosure.

FIG. 3 is a plot illustrating phase shifting voltage(s) producing 0 to $2\pi$ phase shift(s) illustrating that if the sample rate of the phase shifting voltage function is not sufficiently high, the phase function experiences random/uneven jumps according to aspects of the present disclosure.

With reference to FIG. 3, we note that a difficulty involves the sample rate of the electronic function creating the phase change. More particularly, if the sample rate (R) is not very high, there is always a time $$\Delta t = \frac{1}{R}$$

between the last sample made immediately before the 0 phase and the one made immediately after the 2π phase.

If the slope of the phase ramp (which depends on the frequency shift required at that moment $$\zeta = \frac{d\phi}{dt} = \Delta\omega$$

is not chosen in a way that the time cycles $$\left(T = \frac{2\pi}{\zeta}\right)$$

are a multiple of sample time $$\left(T = \frac{2\pi}{\zeta} = N\frac{1}{R}\right),$$

there is always a random jump between the 0 to 2π phase points. Therefore, the sample rate should be increased such that $$\delta t = \frac{1}{R}$$

is very small compared to T, or a method should be applied to alleviate the low sample rate problem leading to increased sidebands, wider frequency spectrum of the signal, and lowered efficiency of frequency conversion.

According to aspects of the present disclosure, we employ two methods to reduce the random jumps in phase namely: (1) the sample times are dynamically adjusted so that there is always a voltage enforcing 0 and 2π phase shifts at the transition points, and (2) Select discrete frequencies for which there is an integer number of samples per period $$\left(\Delta f = \frac{R}{N}\right).$$

Therefor if the frequency is to be swept continuously across a range, at each moment in time the frequency shift is a constant and equal to the sample rate divided by an integer.

Figure 4:
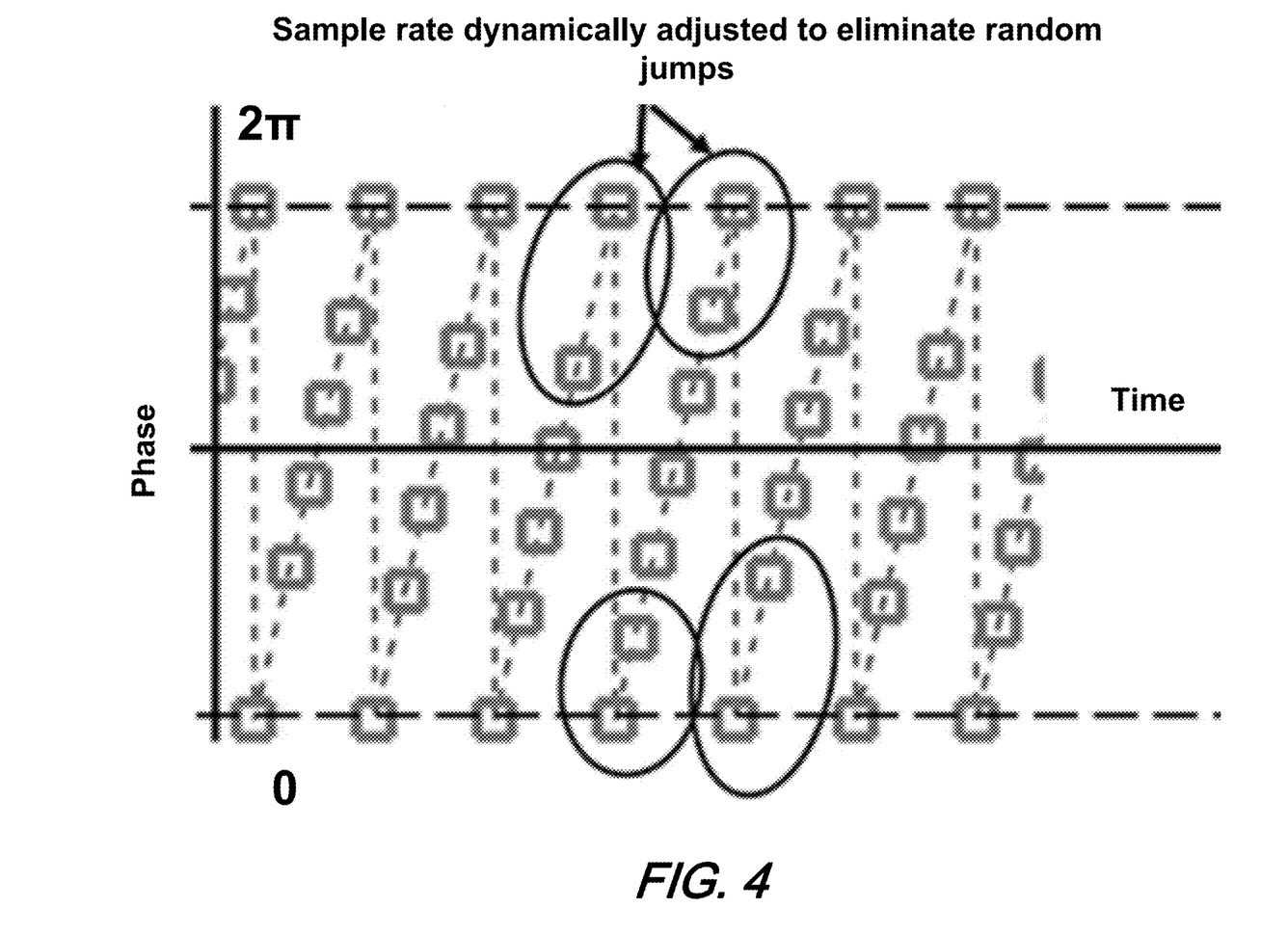
FIG. 4 is a plot of phase shifting voltage(s) producing 0 to $2\pi$ phase shift(s) and the dynamic adjustment of samples near transition points that eliminate random phase jumps according to aspects of the present disclosure.

FIG. 4 is a plot of phase shifting voltage(s) producing 0 to 2π phase shift(s) and the dynamic adjustment of samples near transition points that eliminate random phase jumps according to aspects of the present disclosure.

Figure 5:
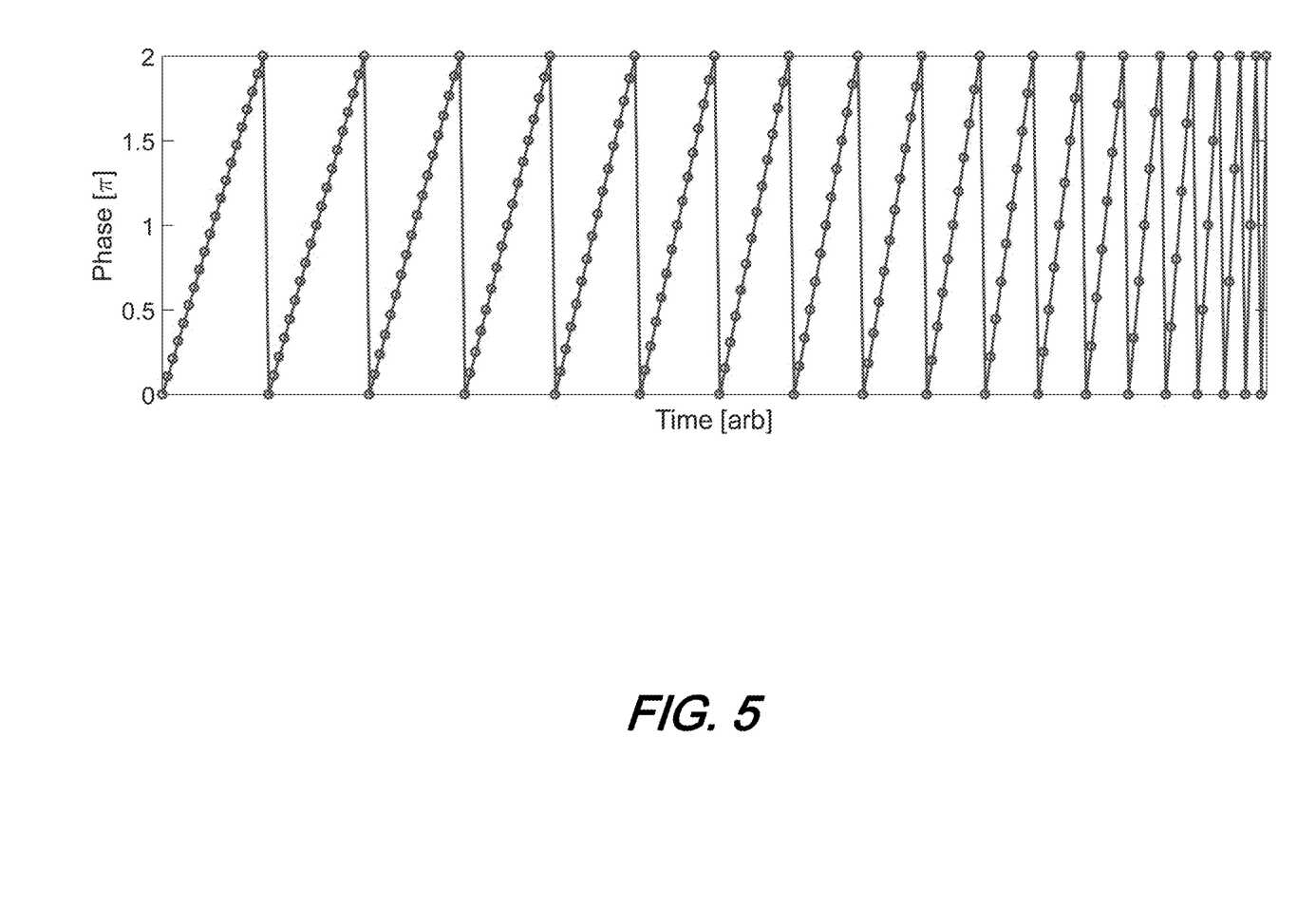
FIG. 5 is a plot of phase shifting voltage(s) producing 0 to $2\pi$ phase shift(s) illustrating that by keeping the frequency shift to discrete values, the ramps will always have an integer number of samples according to aspects of the present disclosure.
Figure 6:
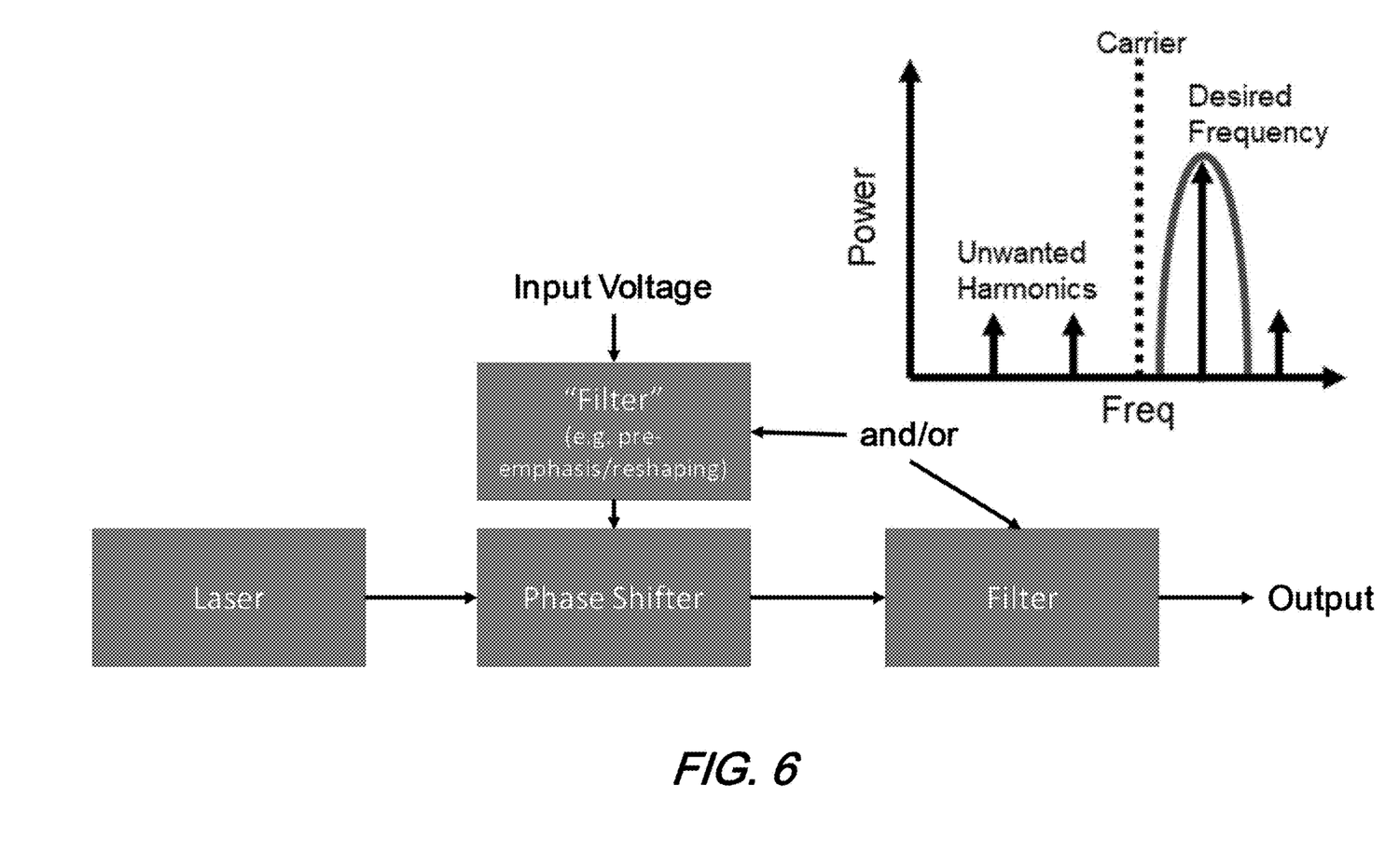
FIG. 6 is a schematic diagram of an illustrative laser system chirped by an external phase shifter including additional filter elements to eliminate unwanted harmonics according to aspects of the present disclosure.

FIG. 5 is a plot of phase shifting voltage(s) producing 0 to 2π phase shift(s) illustrating that by keeping the frequency shift to discrete values, the ramps will always have an integer number of samples according to aspects of the present disclosure;

FIG. 6 is a schematic block diagram of an illustrative laser system chirped by an external phase shifter—such as that previously shown and described—further including additional filter elements to eliminate unwanted harmonics according to aspects of the present disclosure. As may be readily observed from that figure inset, if the frequency chirp is imperfect, unwanted harmonics are present in the output of the phase shifter.

According to further aspects of the present disclosure, a filtering element—for example, a resonant cavity or grating—may be positioned at the output of the phase shifter and filter the chirped light output from the phase shifter to eliminate any unwanted harmonics. Additionally, a "filter" may be employed to adjust/emphasize/reshape any applied input voltage prior to its application to the phase shifter. As previously noted with respect to FIG. 4 and FIG. 5, this electronic filter may adjust the dynamic sampling rate (FIG. 4) or discretize the frequency ramp (FIG. 5) such that each ramp will always exhibit an integer number of samples that may be the same integer number. We note further that since the phase shifter is typically not completely linear with voltage, the filter may advantageously reshape the input voltage to the phase shifter such that phase shift to voltage mapping is desirable for the particular application.

Figure 7:
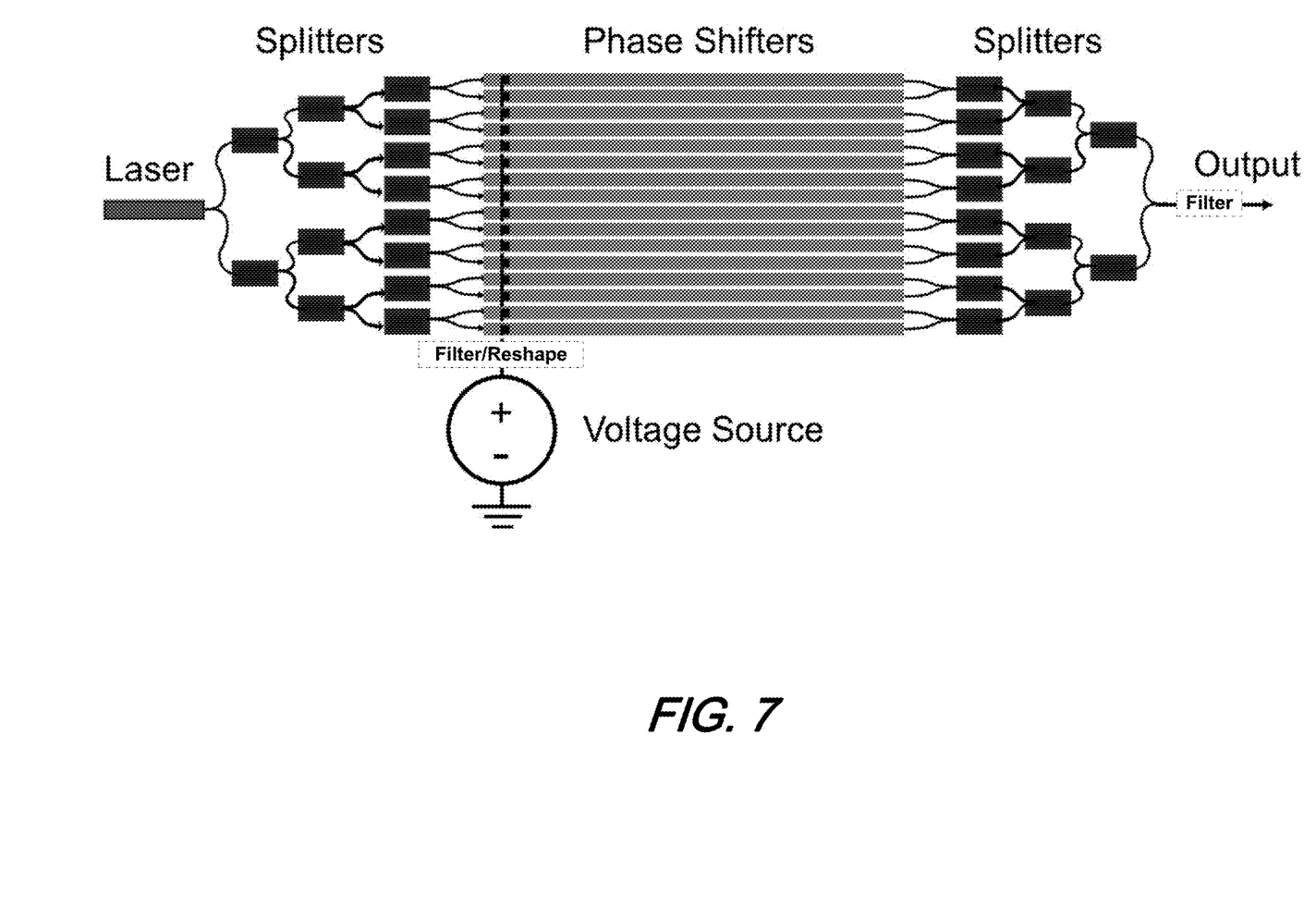
FIG. 7 is a schematic diagram of an illustrative chirped optical system in which light from a single laser is split and directed to a plurality of phase shifters that are collectively controlled by a common time varying input voltage wherein the phase shifted output of the plurality of phase shifters is combined into a single, output according to aspects of the present disclosure.

FIG. 7 is a schematic block diagram of an illustrative laser system according to aspects of the present disclosure. As may be observed from that figure, a laser is optically connected to an input binary tree distribution network (splitters) which in turn is optically connected to input(s) of a plurality of phase shifters—a respective one for each of the branches of the distribution network. Outputs of the phase shifters—in turn—are optically connected to an output binary tree distribution network (splitters) that "funnels down" to a single output. As may be readily understood and appreciated by those skilled in the art, such a configuration provides advantageous power handling and/or on-chip power distribution characteristics.

Figure 8:
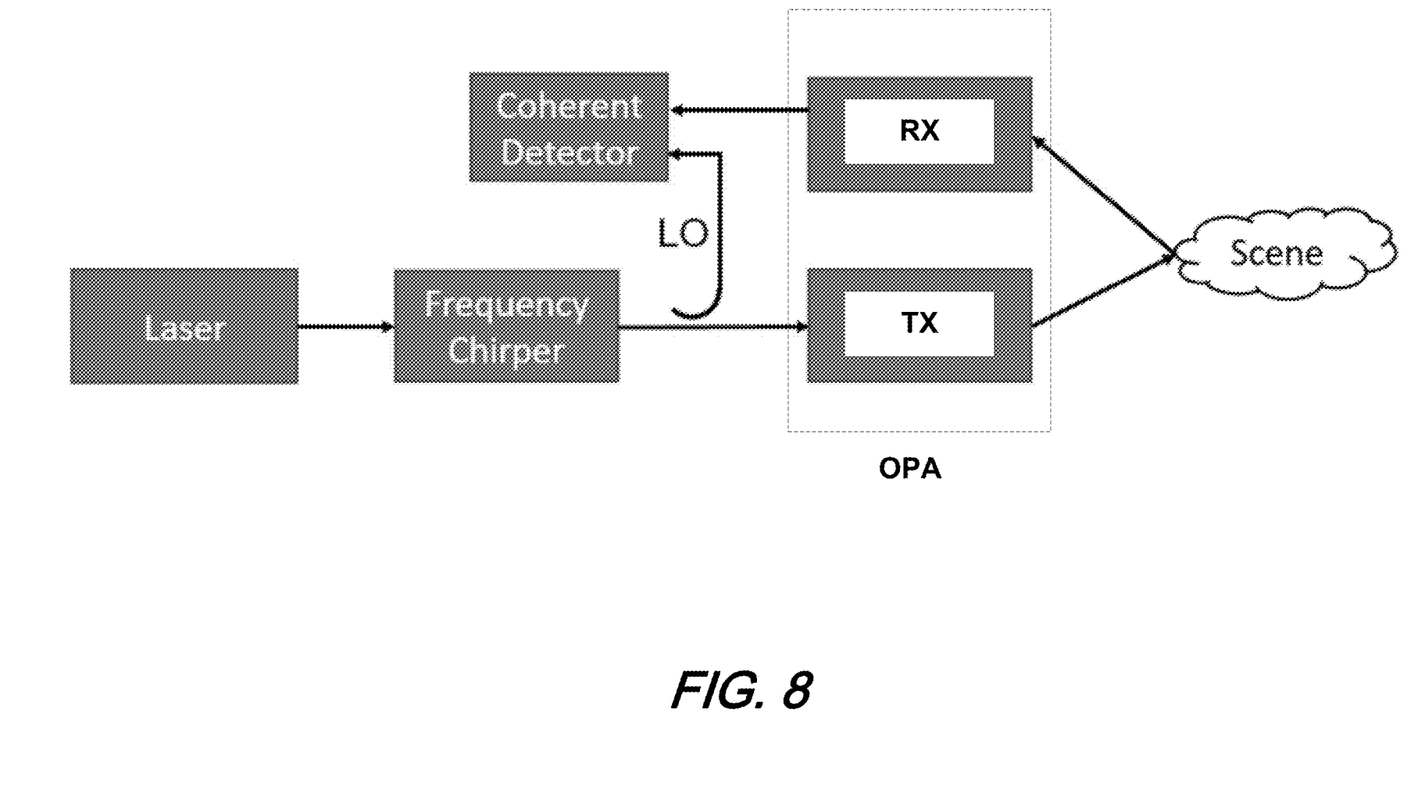
FIG. 8 is a schematic diagram of an illustrative optical ranging system including optical phased arrays and a laser system chirped by an external phase shifter according to aspects of the present disclosure.

Turning now to FIG. 8, there is shown a schematic block diagram of an illustrative ranging system according to aspects of the present disclosure. As may be observed from that figure, a laser system with frequency chirper is further integrated into a ranging system including a coherent detector and optical phased array(s). As illustratively shown in the figure, the optical phased array (or arrays) provide a aperture(s) for emitting/receiving interrogating radiation of a scene and indication/distance/movement(s) of any objects that are within that scene.

In one illustrative embodiment, the light output from the laser is split by the effect of the distribution network and the split light is applied to the phase shifters. The phase shifters then shift the phase of the light traversing therein, and that phase shifted light is subsequently recombined and output through the effect of an output distribution network. As shown, each one of the individual phase shifters is driven by a common applied voltage. Of further advantage, such applied voltage may be optionally filtered/reshaped prior to application as desired. Similarly, the phase shifted, combined, output light may be optionally filtered prior to output. Finally, as was the case previously described, the input voltage applied to the phase shifters may be quadratically increasing and applied to each of the phase shifters simultaneously.

Turning now to FIG. 7, there is shown a schematic block diagram of an illustrative ranging system according to aspects of the present disclosure. As may be observed from that figure, a laser system with frequency chirper is further integrated into a ranging system including a coherent detector and optical phased array(s). As illustratively shown in the figure, the optical phased array (or arrays) provide a aperture(s) for emitting/receiving interrogating radiation of a scene and indication/distance/movement(s) of any objects that are within that scene.

At this point, while we have presented this disclosure using some specific examples, those skilled in the art will recognize that our teachings are not so limited. Accordingly, this disclosure should be only limited by the scope of the claims attached hereto.

The invention claimed is:

1. A frequency chirping structure comprising:
a laser for generating a beam of laser light;
a phase shifter that shifts the phase of the laser light in response to an input voltage; and
a driving circuit that generates the input voltage, wherein the generated input voltage varies as a function of time over a first time interval such that the phase of the laser light is shifted quadratically as a function of time;
wherein the laser light is phase shifted by an amount based on samples of the input voltage selected according to sample times that are dynamically adjusted such that each of multiple consecutive intervals of time over which the phase shift amount is wrapped includes samples that span across a range that has a size of at least $2\pi$.

2. The structure of claim 1 wherein the phase shifter is one selected from the group consisting of: electro-optical, thermal, resonant cavity, acousto-optical, micro-electromechanical (MEMS), and liquid crystal.

3. The structure of claim 1 further comprising a filter that removes one or more harmonics from the phase shifted laser light.

4. The structure of claim 1 further comprising an electrical filter that reshapes the input voltage prior to application of the input voltage to the phase shifter such that the quadratic phase shift is produced in the laser light.

5. The structure of claim 1 wherein the phase shifted laser light also exhibits a frequency offset due to the effect of the phase shifter.

6. The structure of claim 1 wherein the phase of the laser light is shifted such that a frequency of the laser light increases linearly as a function of time over the first time interval, and the generated input voltage varies as a function of time over a second time interval such that the frequency of the laser light decreases linearly as a function of time over the second time interval, wherein the first time interval and the second time interval are substantially equal.

7. A phase shifting structure comprising:
a laser that generates laser light;
a plurality of phase shifters, each individual one of the phase shifters configured to shift the phase of the laser light in response to an input voltage, wherein a time-dependent phase shift imparted in each individual phase shifter over a first time interval is substantially equal to a time-dependent phase shift imparted by each of the other individual phase shifters over the first time interval;
a driving circuit that generates the input voltage; and
an optical distribution network configured to optically connect the laser with an input of each individual one of the plurality of phase shifters; and
an output optical combination network that receives phase shifted laser light output from each individual one of the plurality of phase shifters and combines the received light into a common output, wherein the substantially equal time-dependent phase shifts maintain an optical power of output light from the common output over the first time interval.

8. The phase shifting structure of claim 7 wherein individual ones of the plurality of phase shifters is selected from the group consisting of: electro-optical, thermal, resonant cavity, acousto-optical, micro-electromechanical (MEMS), and liquid crystal.

9. The phase shifting structure of claim 7 wherein the generated input voltage varies as a function of time over the first time interval such that the phase of the laser light is shifted quadratically as a function of time.

10. The phase shifting structure of claim 9 further comprising a filter that removes one or more harmonics from the phase shifted laser light prior to common output.

11. The phase shifting structure of claim 9 further comprising an electronic filter that reshapes the input voltage prior to application of the input voltage to the phase shifters such that quadratic phase shift is produced in the laser optical source light.

12. The phase shifting structure of claim 9 wherein the phase shifted laser optical source light also exhibits a frequency offset due to effect of the phase shifter.

13. The phase shifting structure of claim 7 wherein the output network includes path length matched splitters and/or combiners.

14. The phase shifting structure of claim 7 wherein the laser light is phase shifted by an amount based on samples of the input voltage selected according to sample times that are dynamically adjusted such that each of multiple consecutive intervals of time over which the phase shift amount is wrapped includes samples that span across the range of 0 to $2\pi$.

15. An optical structure comprising:
a laser that outputs laser light;
a frequency chirping structure external to the laser that receives the laser light and generates frequency chirped light exhibiting a frequency that varies substantially linearly as a function of time over a first time interval;
a transmit aperture including phased array elements that emits the frequency chirped light into an interrogation area;
a receive aperture including phased array elements that receives frequency chirped light backscattered from the interrogation area; and
a coherent detector that receives frequency chirped light from the chirping structure and the received backscattered light for processing.

16. The optical structure of claim 15 wherein the phased array elements, the frequency chirping structure and the coherent detector are integrated onto a common substrate.

17. The optical structure of claim 16 wherein the laser is integrated onto the common substrate.

18. The optical structure of claim 15 wherein the frequency chirping structure includes one or more phase shifters configured to shift the phase of the laser light in response to an input voltage, wherein the input voltage varies as a function of time over a first time interval such that phase of the laser light is shifted quadratically as a function of time.

19. The optical structure of claim 15 wherein the frequency chirped light exhibits a frequency that increases linearly as a function of time over the first time interval and decreases linearly as a function of time over a second time interval, wherein the first time interval and the second time interval are substantially equal.

20. The optical structure of claim 15 wherein the phased array elements of the transmit aperture are included in a first optical phased array, and the phased array elements of the receive aperture are included in a second optical phased array different from the first optical phased array.

21. The optical structure of claim 15 wherein the phased array elements of the transmit aperture are included in a first optical phased array, and the phased array elements of the receive aperture are included in the first optical phased array.

22. A method of providing a beam of electromagnetic radiation exhibiting a time-varying frequency, the method comprising:
    providing a first beam of electromagnetic radiation from a laser source;
    directing the first beam of electromagnetic radiation to a phase shifting device, said phase shifting device responsive to an input voltage; and
    applying a time varying input voltage to the phase shifting device such that a second beam of electromagnetic radiation output from the phase shifting device exhibits the time-varying frequency due to the phase of the first beam of electromagnetic radiation being shifted quadratically as a function of time over a first time interval;
    wherein the phase of the first beam of electromagnetic radiation is shifted by an amount based on samples of the input voltage selected according to sample times that are dynamically adjusted such that each of multiple consecutive intervals of time over which the phase shift amount is wrapped includes samples that span across a range that has a size of at least $2\pi$.

23. The method of claim 22 further comprising filtering the second beam of electromagnetic radiation such that one or more harmonics are removed.

24. The method of claim 22 wherein the phase of the first beam of electromagnetic radiation is shifted as a function of time over the first time interval such that a frequency of the second beam of electromagnetic radiation increases linearly as a function of time over the first time interval, and the phase of the first beam of electromagnetic radiation is shifted as a function of time over a second time interval such that the frequency of the second beam of electromagnetic radiation decreases linearly as a function of time over the second time interval, wherein the first time interval and the second time interval are substantially equal.

* * * * *